(12) United States Patent
Ooyabu et al.

(10) Patent No.: US 7,471,519 B2
(45) Date of Patent: Dec. 30, 2008

(54) WIRED CIRCUIT BOARD

(75) Inventors: Yasunari Ooyabu, Osaka (JP); Yasuhito Funada, Osaka (JP); Hitoki Kanagawa, Osaka (JP); Tetsuya Ohsawa, Osaka (JP)

(73) Assignee: Nitto Denko Corporation, Osaka (JP)

( * ) Notice: Subject to any disclaimer, the term of this patent is extended or adjusted under 35 U.S.C. 154(b) by 329 days.

(21) Appl. No.: 11/187,865

(22) Filed: Jul. 25, 2005

(65) Prior Publication Data

US 2006/0023435 A1 Feb. 2, 2006

(30) Foreign Application Priority Data

Jul. 27, 2004 (JP) ............... 2004-219217

(51) Int. Cl.
*H05K 1/00* (2006.01)
(52) U.S. Cl. ............. 361/749; 361/750; 174/254; 174/259
(58) Field of Classification Search ......... 361/749–750, 361/803; 174/254–258
See application file for complete search history.

(56) References Cited

U.S. PATENT DOCUMENTS

| | | | |
|---|---|---|---|
| 6,166,888 A | | 12/2000 | Tsuda et al. |
| 6,256,170 B1 * | | 7/2001 | Honda ............... 360/234.5 |
| 6,268,980 B1 * | | 7/2001 | Shiraishi et al. ...... 360/234.5 |
| 6,326,553 B1 | | 12/2001 | Yim et al. |
| 6,388,840 B1 * | | 5/2002 | Ohwe .................. 360/244.1 |
| 6,826,016 B2 * | | 11/2004 | Katsumata ........... 360/245.9 |
| 2001/0030836 A1 | | 10/2001 | Katsumata |
| 2002/0034050 A1 | | 3/2002 | Fujiwara et al. |
| 2002/0100609 A1 | | 8/2002 | Ookawa et al. |
| 2003/0053257 A1 | | 3/2003 | Wada et al. |
| 2003/0099065 A1 | | 5/2003 | Watanabe |

FOREIGN PATENT DOCUMENTS

| | | |
|---|---|---|
| JP | 11-185231 | 7/1999 |
| JP | 2002-222578 | 8/2002 |
| JP | 2003-22509 | 1/2003 |
| JP | 2003-91805 | 3/2003 |
| JP | 2003-162875 | 6/2003 |

* cited by examiner

*Primary Examiner*—Tuan T Dinh
(74) *Attorney, Agent, or Firm*—Jean C. Edwards, Esq.; Akerman Senterfitt (57) ABSTRACT

A wired circuit board that can prevent inconsistency in characteristic impedance to allow effective transmission of electrical signals from a magnetic head to a control board portion. A wired circuit board is constructed so that a suspension board portion for supporting the magnetic head and a control board portion for controlling the magnetic head are formed to be continuous and integral with each other. To be more specific, a first conductor layer connected to the magnetic head in the suspension board portion and a second conductor layer connected to a preamplifier IC in the control board portion are formed from the same material and formed on a common insulating base layer simultaneously. Further, a common insulating cover layer to cover the first conductor layer and the second conductor layer is formed on the common insulating base layer.

3 Claims, 5 Drawing Sheets

PRIOR ART

FIG. 5

WIRED CIRCUIT BOARD

BACKGROUND OF THE INVENTION

1. Field of the Invention

The present invention relates to a wired circuit board and, more particularly, to a wired circuit board used for a hard disc drive.

2. Description of the Prior Art

Figure 4:
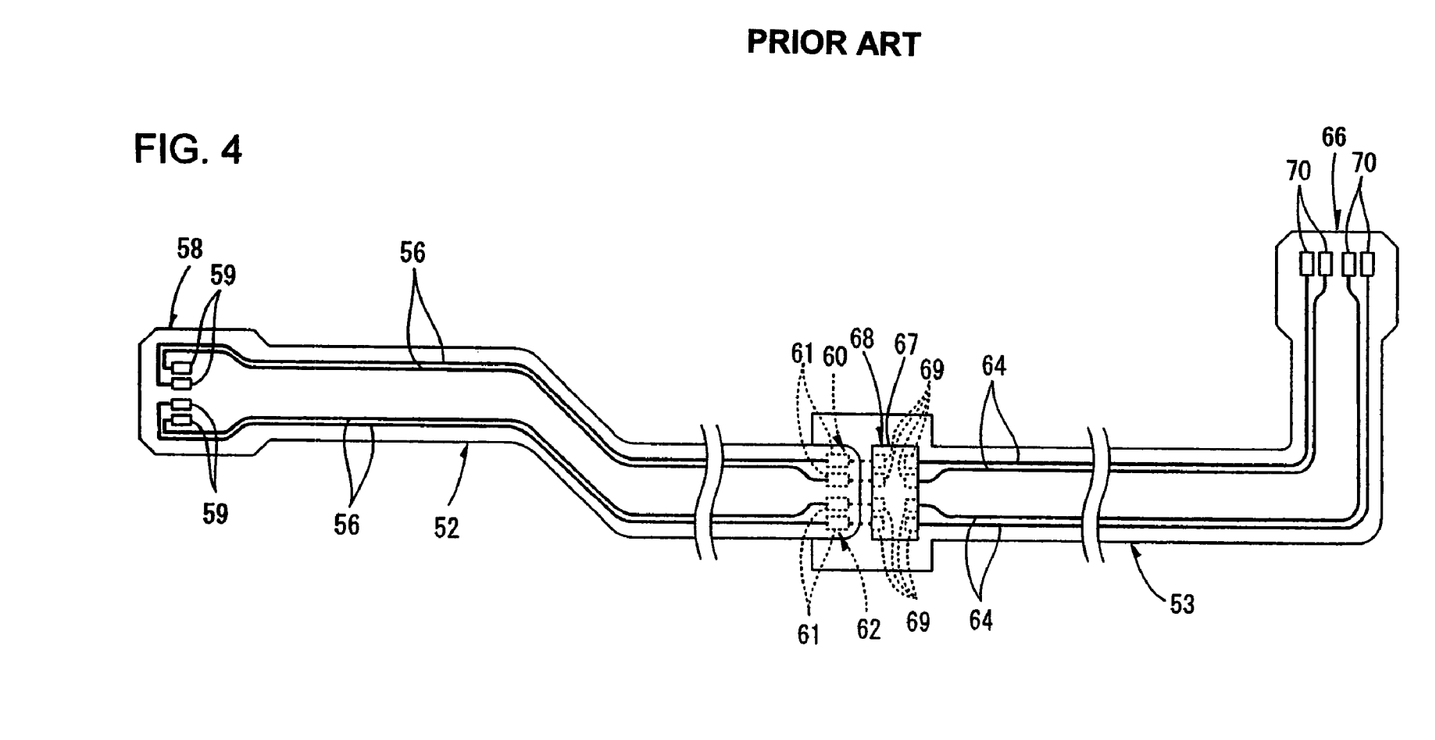
FIG. 4 is a plan view showing a conventional arrangement of a suspension board with circuit and a control circuit board.

As shown in FIG. 4, the hard disk drive comprises a suspension board with circuit 52 on which a magnetic head 51 (See FIG. 5) is mounted, and a control circuit board 53, connected to the suspension board with circuit 52, for controlling the magnetic head 51.

Figure 5:
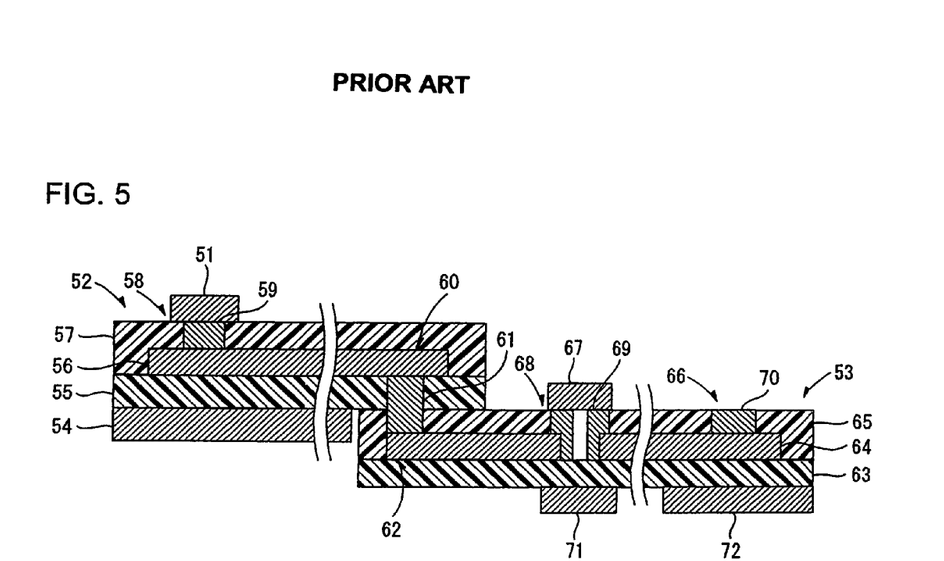
FIG. 5 is a sectional view of a principal part of the conventional arrangement of the suspension board with circuit and the control circuit board shown in FIG. 4 taken along line extending along the longitudinal direction thereof.

As shown in FIG. 5, the suspension board with circuit 52 comprises an insulating base layer 55, a conductor layer 56 comprising a wired circuit pattern, and an insulating cover layer 57, which are sequentially laminated in layers on a metal board 54 of a stainless foil and the like.

The suspension board with circuit 52 is provided, at one lengthwise end portion thereof, with a magnetic head terminal portion 58 for mounting the magnetic head on it. The magnetic head terminal portion 58 is formed by opening the insulating cover layer 57 at one end portion thereof to expose the conductor layer 56 therefrom. Then, the magnetic head 51 is mounted on the one end portion of the insulating cover layer 57 and connected to the magnetic head terminal portion 58 through a plating layer 59.

The suspension board with circuit 52 is provided, at the other lengthwise end portion thereof, with a control circuit board terminal portion 60 for connection with the control circuit board 53. The control circuit board terminal portion 60 is formed by opening the insulating base layer 55 at the other end portion thereof to expose the conductor layer 56 therefrom. Then, the other end portion of the suspension board with circuit 52 is disposed opposite to one end portion of the control circuit board 53 and, then, the control circuit board terminal portion 60 is connected to a suspension board terminal portion 62 through a plating layer 61, as mentioned below.

The control circuit board 53 comprises an insulating base layer 63, a conductor layer 64 comprising a wired circuit pattern, and an insulating cover layer 65, which are sequentially laminated in layers. It also has stiffening layers 71, 72 laminated on the insulating base layer 63 at portions thereof corresponding to a preamplifier terminal portion 68 and an external terminal portion 66 on the side opposite to the side on which the insulating base layer 63 and the conductor layer 64 are laminated.

The control circuit board 53 is provided, at one lengthwise end portion thereof, with a suspension board terminal portion 62 for connection with the control circuit board terminal portion 60 as mentioned above. The suspension board terminal portion 62 is formed by opening an insulating cover layer 65 at one end portion thereof to expose a conductor layer 64 therefrom. Then, the other end portion of the suspension board with circuit 52 is disposed opposite to one end portion of the control circuit board 53 and, then, the control circuit board terminal portion 60 is connected to the suspension board terminal portion 62 through the plating layer 61.

The control circuit board 53 is provided, at the other lengthwise end portion thereof, with an external terminal portion 66 for connection with various control devices. The external terminal portion 66 is formed by opening the insulating cover layer 65 at the other end portion of the control circuit board 53 to expose the conductor layer 64 therefrom. Then, various control devices, not shown, are disposed opposite to the other end portion of the control circuit board 53 and then connected to the external terminal portion 66 through a plating layer 70.

The control circuit board 53 is provided with the preamplifier terminal portion 68 for connection with the preamplifier IC 67 at a location near the one lengthwise end thereof. The preamplifier IC portion 68 is formed by opening the insulating cover layer 65 at the location near the one end portion thereof to expose the conductor layer 64 therefrom. Then, the preamplifier IC 67 is mounted on the control circuit board 53 at the location near the one end portion of the control circuit board 53 and then connected to the preamplifier terminal portion 68 through a plating layer 69.

Electric signals output from the magnetic head 51 are transmitted therefrom to the control circuit board terminal portion 60 and the suspension board terminal portion 62 through the conductor layer 56 of the suspension board with circuit 52. Then, after having relayed via the control circuit board terminal portion 60 and the suspension board terminal portion 62, the signals are transmitted to the conductor layer 64 of the control circuit board 53 and amplified by the preamplifier IC 67. Then, the signals amplified are output from the external terminal portion 66 to the various control devices.

It is known that a relay flexible wiring circuit board is interposed between the suspension substrate and the control circuit substrate (Cf. JP Patent Laid-open (Unexamined) Patent Publication No. 2002-222578, for example).

Meanwhile, along with improvements in recent years to high-density of the wired circuit board, fine-pitch of wiring, and high-frequency of electrical signal, it is becoming important to control characteristic impedances in the transmission of the electrical signals from the suspension board with circuit to the control circuit board.

However, electrical resistance changes significantly at connection points between the control circuit board terminal portion 60 and the suspension board terminal portion 62, then causing inconsistency in characteristic impedance thereat.

SUMMARY OF THE INVENTION

It is an object of the invention to provide a wired circuit board that can prevent inconsistency in characteristic impedance to allow effective transmission of electrical signals from the magnetic head to the control board portion.

The present invention provides a novel wired circuit board comprising a suspension board portion, having a first conductor layer connected to a magnetic head, for supporting the magnetic head, and a control board portion, having a second conductor layer connected to a preamplifier, for controlling the magnetic head, wherein the suspension board portion and the control board portion are formed to be continuous and integral with each other, and the first conductor layer and the second conductor layer are formed from the same material.

In the wired circuit board of the present invention, it is preferable that the first conductor layer and the second conductor layer are electrically connected with each other through the preamplifier by connecting the first conductor layer to the preamplifier.

In the wired circuit board of the present invention, it is preferable that the suspension board portion and the control board portion have a common insulating base layer formed from the same material to be continuous and integral with each other, and wherein the first conductor layer in the suspension board portion is formed on the common insulating base layer and the second conductor layer in the control circuit portion is formed on the common insulating base layer.

In this embodiment, it is preferable that the suspension board portion and the control board portion have a common insulating cover layer formed from the same material to be continuous and integral with each other, and wherein the common insulating cover layer in the suspension board portion is formed on the common insulating base layer to cover the first conductor layer and the common insulating cover layer in the control board portion is formed on the common insulating base layer to cover the second conductor layer.

According to the wired circuit board of the present invention, the suspension board portion for supporting the magnetic head and the control board portion for controlling the magnetic head are arranged to be continuous and integral with each other, and also the first conductor layer and the second conductor layer are formed from the same material. This arrangement can eliminate the need of providing the connection point for connecting the first conductor layer of the suspension board portion and the second conductor layer of the control board portion at the boundary therebetween. This can provide the result of preventing inconsistency in characteristic impedance at that connection point to allow effective transmission of electrical signals from the magnetic head to the control board portion.

BRIEF DESCRIPTION OF THE DRAWINGS

In the drawings.

(b) shows the process of forming an insulating base layer on the metal board.

(c) shows the process of forming a first conductor layer and a second conductor layer on the insulating base layer from the same material simultaneously.

(d) shows the process of forming an insulating cover layer on the insulating base layer to cover the first conductor layer and the second conductor layer.

(e) shows the process of removing the metal board partly; and (f) shows the process of forming a magnetic head terminal portion, an external terminal portion, and a preamplifier terminal portion.

DETAILED DESCRIPTION OF THE PREFERRED EMBODIMENTS

Figure 1:
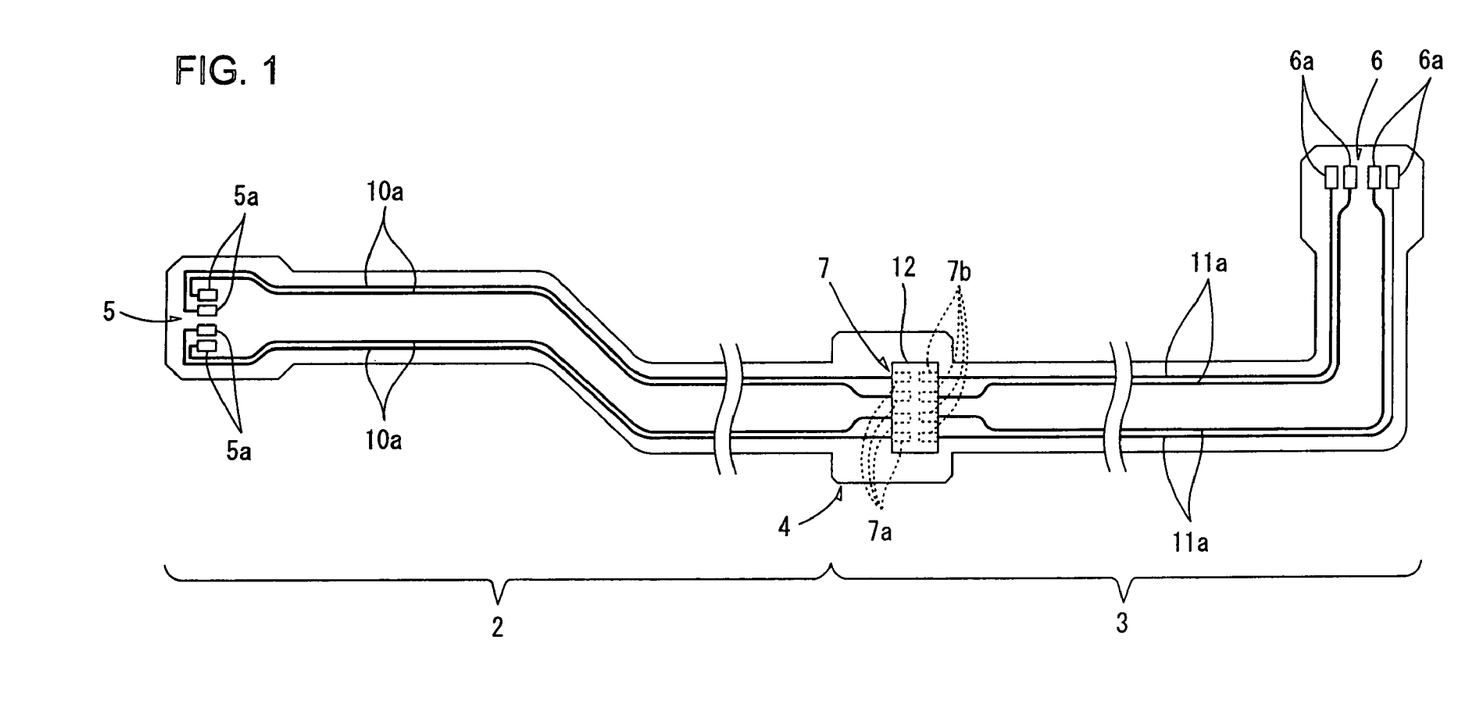
FIG. 1 is a plan view showing an embodiment of a wired circuit board of the present invention.
Figure 2:
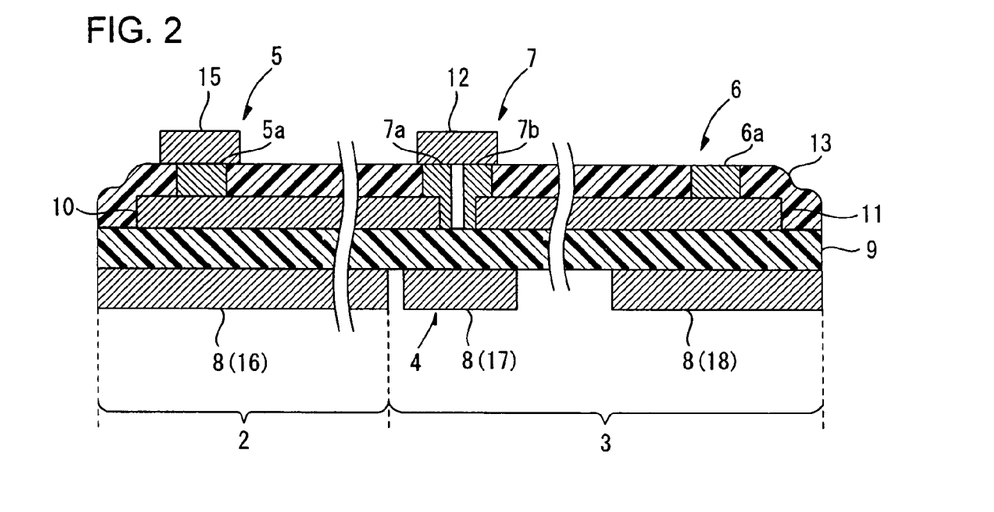
FIG. 2 is a sectional view of a principal part of the wired circuit board shown in FIG. 1 taken along line extending along a longitudinal direction thereof.

FIG. 1 is a plan view showing an embodiment of a wired circuit board of the present invention, and FIG. 2 is a sectional view of a principal part of the wired circuit board shown in FIG. 1 taken along line extending along a longitudinal direction thereof.

In FIG. 1, this wired circuit board 1 comprises a suspension board portion 2 for supporting a magnetic head 15 (Cf FIG. 2) and a control board portion 3 for controlling the magnetic head 15. The suspension board portion 2 and the control board portion 3 are arranged continuously and integrally.

The suspension board portion 2 is arranged at one lengthwise side of the wired circuit board 1. The suspension board portion 2 is formed in a generally crank-like form, as viewed from top, and has, at one end portion thereof, a magnetic head terminal portion 5 for connection with the magnetic head 15. In the magnetic head terminal portion 5, a plurality of terminals 5a are arranged in parallel along a widthwise direction of the wired circuit board 1 (a direction orthogonal to a longitudinal direction of the wired circuit board 1 (this definition applied to the following)).

In the suspension board portion 2, a first conductor layer 10 to be connected to the magnetic head terminal portion 5 is formed in the form of a wired circuit pattern. The first conductor layer 10 is formed so that one end portion thereof extends to the magnetic head terminal portion 5 and the other end portion thereof extends to a connection point to be connected with a preamplifier terminal portion 7 mentioned later and is formed in the form of a plurality of wires 10a spaced apart from each other at a predetermined distance and arranged in parallel along the widthwise direction of the wired circuit board 1. These wires 10a are connected with their respective terminals 5a of the magnetic head terminal portion 5 at one end portion thereof and are connected with the preamplifier terminal portion 7 at the other end portion thereof.

The control board portion 3 is arranged at the other lengthwise side of the wired circuit board 1. The control board portion 3 is formed in a generally L-shape, as viewed from top, and has an external terminal portion 6 and a preamplifier mounting portion 4. In the external terminal portion 6, a plurality of terminals 6a for connection with various control devices are arranged in parallel along the widthwise direction at the other end portion of the wired circuit board 1.

In the control board portion 3, a second conductor layer 11 to be connected to the external terminal portion 6 is formed in the form of a wired circuit pattern. The second conductor layer 11 is formed so that one end portion thereof extends to a connection point to be connected with the preamplifier terminal portion 7 and the other end portion thereof extends to the external terminal portion 6 and is formed in the form of a plurality of wires 11a spaced apart from each other at a predetermined distance and arranged in parallel along the widthwise direction of the wired circuit board 1. These wires 11a are connected with the preamplifier terminal portion 7 at one end portion thereof and are connected with their respective terminals 6a of the external terminal portion 6 at the other end portion thereof.

The preamplifier mounting portion 4 is arranged partway along a length of the wired circuit board 1 and at one end portion of the control board portion 3 on the side adjoining to the suspension board portion 2. The preamplifier mounting portion 4 is formed in a generally enlarged rectangular shape as viewed from top and is equipped with the preamplifier terminal portion 7. In the preamplifier terminal portion 7, the first terminals 7a connected with the first conductor layer 10 and the second terminals 7b connected with the second conductor layer 11 are arranged opposite to and spaced apart from each other at a predetermined distance in the longitudinal direction. The first terminals 7a and the second terminals 7b are arranged in parallel along the widthwise direction of the wired circuit board 1. The first conductor layer 10 and the second conductor layer 11 extend to the preamplifier terminal portion 7, as mentioned above. In the preamplifier terminal portion 7, the wires 10a of the first conductor layer 10 are connected to the associated first terminals 7a, respectively, and the wires 11a of the second conductor layer 11 are connected to the associated second terminals 7b, respectively.

Also, a preamplifier IC 12 is mounted on this preamplifier terminal portion 7, and the first terminals 7a and the second terminals 7b are connected to the preamplifier IC 12.

Figure 3:
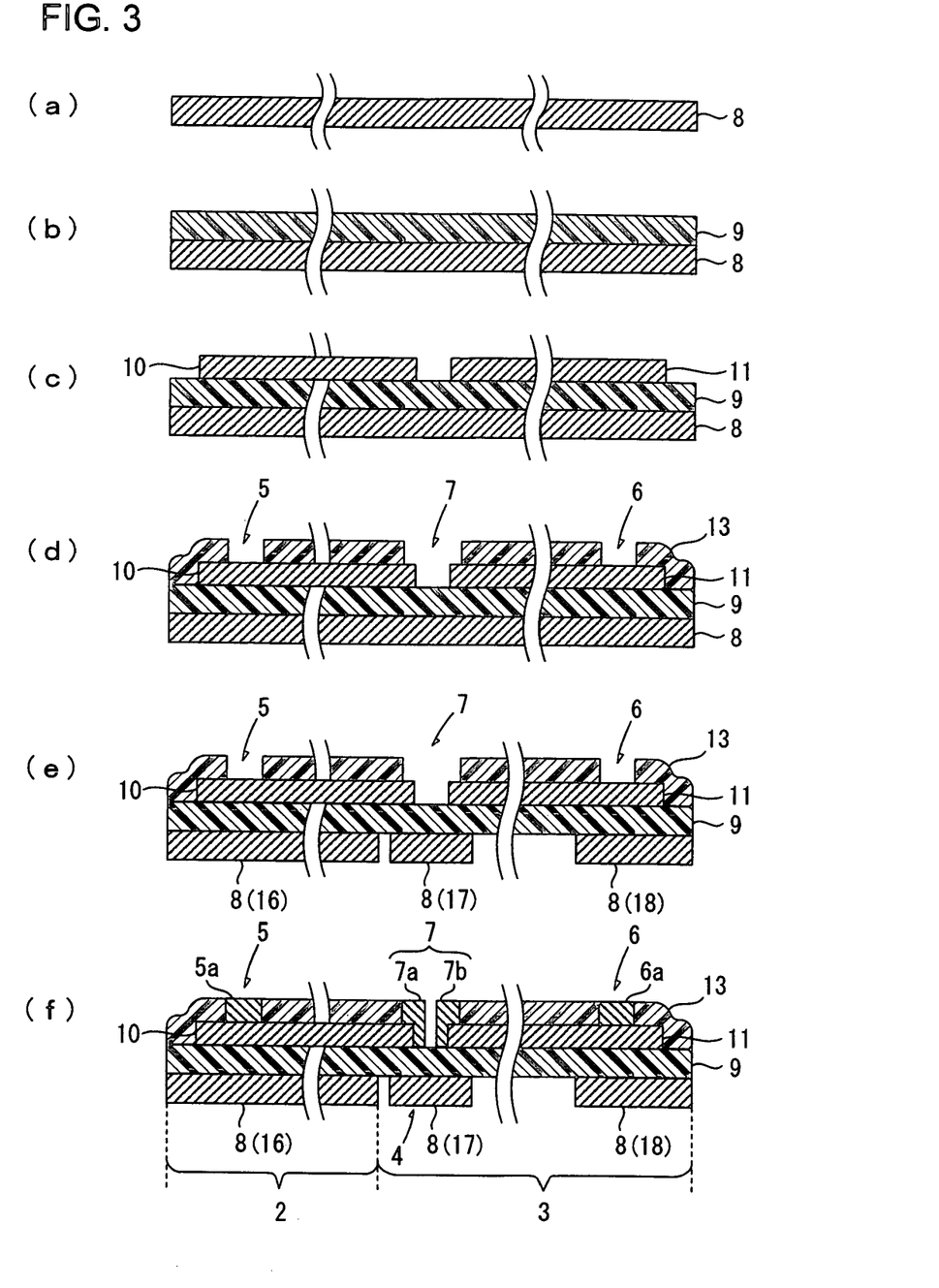
FIG. 3 is a production process drawing showing production processes of the wired circuit board shown in FIG. 1, (a) shows the process of preparing a metal board.

Next, a production method of this wired circuit board 1 will be briefly described with reference to FIG. 3.

In this method, a metal board 8 is prepared, first, as shown in FIG. 3(a).

No particular limitation is imposed on the material of the metal board 8. For example, a metal foil or a thin metal sheet, such as, for example, stainless steel and 42-alloy, is used for the metal board 8. Preferably, the metal board 8 has a thickness of 10-100 μm, or preferably 15-30 μm.

Then, the suspension board portion 2 and the control board portion 3 are formed to have a common insulating base layer 9 formed from the same material to be continuous and integral with each other and formed in the form of a predetermined pattern, as shown in FIG. 3(b). The insulating materials that may be used for forming the insulating base layer 9 include, for example, synthetic resins, such as polyimide resin, acrylic resin, polyether nitrile resin, polyether sulfonic resin, polyethylene terephthalate resin, polyethylene naphthalate resin, and polyvinyl chloride resin. Of these synthetic resins, a photosensitive synthetic resin is preferably used for forming the insulating base layer 9 in the form of the predetermined pattern. The photosensitive polyimide resin is further preferably used therefor.

For example when photosensitive polyimide resin is used to form the insulating base layer 9 on the metal board 8 in the predetermined pattern, varnish of precursor of the photosensitive polyimide resin (polyamic acid resin) is coated over the entire surface of the metal board 8, first, and, then dried, to form a coating of the precursor of the photosensitive polyimide resin. Then, the coating is exposed to light through a photo mask, and, if required, is heated. Thereafter, the coating is developed to be formed into the predetermined pattern. Then, the coating thus patterned is heated finally to e.g. 250° C. or more to be cured (imidized), whereby the insulating base layer 9 of polyimide resin is formed with the predetermined pattern.

As an alternative to the photosensitive synthetic resin, for example synthetic resin may be formed in the form of the dry film of the predetermined pattern and may be adhesively bonded to the metal board 8.

The insulating base layer 9 is formed to have a thickness of e.g. 1-30 μm.

Then, the first conductor layer 10 and the second conductor layer 11 are formed in the wiring circuit pattern mentioned above on the common insulating base layer 9, simultaneously, as shown in FIG. 3(c). The first conductor layer 10 and the second conductor layer 11 are formed from the same material. For example, the first conductor layer 10 and the second conductor layer 11 are formed from copper, nickel, gold, solder, or alloys thereof. Preferably, they are formed from copper.

The first conductor layer 10 and the second conductor layer 11 which are in the form of the predetermined wiring circuit pattern mentioned above can be formed on the common insulating base layer 9 by a known patterning process, such as a subtractive process and an additive process.

In the subtractive process, the first conductor layer 10 and the second conductor layer 11 are laminated on the entire surface of the insulating base layer 9 simultaneously, using, if necessary, an adhesive layer, first. Then, an etching resist having the same pattern as the wiring circuit pattern is formed on the first conductor layer 10 and the second conductor layer 11, and the first conductor layer 10 and the second conductor layer 11 are etched simultaneously, using the etching resist as a resist. Thereafter, the etching resist is removed.

In the additive process, a seed film of a thin film of conductive material is formed on the insulating base layer 9 by sputtering and the like, first. Then, after a plating resist having a reverse pattern to the wiring circuit pattern is formed on the seed film, the first conductor layer 10 and the second conductor layer 11 are formed in the form of the wiring circuit pattern by electrolytic plating on a surface of the seed film exposed from the plating resist simultaneously. Thereafter, the plating resist and the part of the seed film on which the plating resist was laminated are removed.

Of these patterning processes, the additive process is preferably used in terms of its capability of forming a fine wiring circuit pattern.

The first conductor layer 10 and the second conductor layer 11 have thickness of e.g. 2-25 μm, or preferably 5-20 μm.

Preferably, a protective metal film of a hard, thin nickel film is formed on the surfaces of the first conductor layer 10 and the second conductor layer 11 by electroless nickel plating or the like, though not shown. The protective metal film has a thickness of e.g. 0.05-0.1 μm.

Then, the suspension board portion 2 and the control board portion 3 are formed to have a common insulating cover layer 13 formed from the same material to be continuous and integral with each other and formed in the form of a predetermined pattern, as shown in FIG. 3(d).

The insulating cover layer 13 is formed on the insulating base layer 9 in the form of a predetermined pattern to cover the first conductor layer 10 and the second conductor layer 11 and also open at a location where the terminals 5a of the magnetic head terminal portion 5 is formed, a location where the terminals 6a of the external terminal portion 6, and a location where the first terminals 7a and the second terminals 7b of the preamplifier terminal portion 7 are formed.

The insulating cover layer 13 can be formed from the same material as that of the insulating base layer 9 in the same way. For example, when photosensitive polyimide resin is used to form the insulating cover layer 13, varnish of precursor of the photosensitive polyimide resin (polyamic acid resin) is coated over the entire surface of the insulating base layer 9, first, and, then dried, to form a coating of the precursor of the photosensitive polyimide resin. Then, the coating is exposed to light through a photo mask, and, if required, is heated. Thereafter, the coating is developed to be formed into the predetermined pattern. Then, the coating thus patterned is heated finally to e.g. 250° C. or more to be cured (imidized), whereby the insulating cover layer 13 of polyimide resin is formed with the predetermined pattern mentioned above.

As an alternative to the photosensitive synthetic resin, for example synthetic resin may be previously formed in the form of the dry film of the predetermined pattern mentioned above and may be adhesively bonded to the insulating base layer 9.

The insulating cover layer 13 is formed to have a thickness of e.g. 1-30 μm.

Then, as shown in FIG. 3(e), the metal board 8 is cut out into a predetermined outer shape by a known etching process such as a chemical etching and also all areas of the metal board 8 confronting the insulating base layer 9, except its portions corresponding to the suspension board portion 2, its portions corresponding to the preamplifier terminal portion 7, and its portions corresponding to the external terminal portion 6, are removed by the known etching process such as the chemical etching.

Then, as shown in FIG. 3(f), the respective terminals 5a, 6a, 7a, 7b formed by the plating layer are formed by electrolytic plating on the surface of the first conductor layer 10 exposed from the insulating cover layer 13 at the location where the terminals 5a of the magnetic head terminal portion 5, on the surface of the second conductor layer 11 exposed from the insulating cover layer 13 at the location where the terminals 6a of the external terminal portion 6, and on the surfaces of the first conductor layer 10 and second conductor layer 11 exposed from the insulating cover layer 13 at the location where the first terminals 7a and second terminals 7b of the preamplifier terminal portion 7, respectively. The wired circuit board 1 is produced in the manner mentioned above.

In this wired circuit board 1, the preamplifier IC 12 is connected to the first terminals 7a and second terminals 7b of the preamplifier terminal portion 7 and the magnetic head 15 is connected to the terminals 5a of the magnetic head terminal portion 5, as shown in FIG. 2. Also, various control devices are connected to the terminals 6a of the external terminal portion 6, though not shown. Then, the wired circuit board 1 thus assembled is mounted on the hard disc drive.

In the suspension board portion 2 of this wired circuit board 1, the metal board 8 serving as the supporting board 16, the insulating base layer 9, the first conductor layer 10, and the insulating cover layer 13 are sequentially laminated in layers, and the magnetic head 15 is supported closely spaced from the magnetic disc. In the control board portion 3, the insulating base layer 9, the second conductor layer 11, and the insulating cover layer 13 are sequentially laminated in layers (the metal board 8 serving as the stiffening layer 18 is arranged on the preamplifier mounting portion 4 and the external terminal portion 6). The electrical signals output from the magnetic head 15 are amplified by the preamplifier IC 12.

In this wired circuit board 1, the electrical signals output from the magnetic head 15 are transmitted from the magnetic head terminal portion 5 to the first conductor layer 10 and then amplified by the preamplifier IC 12 via the preamplifier terminal portion 7. Thereafter, the electrical signals amplified are transmitted to the second conductor layer 11. According to the wired circuit board 1 of this embodiment, the conventional suspension board with circuit and the conventional control circuit board are formed to be continuous and integral with each other, and also the first conductor layer 10 and the second conductor layer 11 are formed from the same material and formed on the common insulating base layer 9 simultaneously. This arrangement of the wired circuit board can eliminate the need of providing the connection point for connecting the first conductor layer 10 of the suspension board portion 2 and the second conductor layer 11 of the control board portion 3 at the boundary therebetween. This can provide the result of preventing inconsistency in characteristic impedance at that connection point to allow effective transmission of electrical signals from the magnetic head 15 to the control board portion 3.

Besides, according to this wired circuit board 1, the insulating base layer 9 and the insulating cover layer 13 which are common to the suspension board portion 2 and the control board portion 3 are formed from the same material and formed to continuously extend therebetween. This arrangement can further effectively prevent the inconsistency in characteristic impedance.

EXAMPLES

While in the following, the present invention will be described in further detail with reference to Example and Comparative Example, the present invention is not limited to any of Example and Comparative Example.

Example 1

A metal board of a stainless foil having a thickness of 25 μm (SUS304H-TA) was prepared, first (Cf. FIG. 3(a)). Then, solution of precursor of photosensitive polyimide resin was coated over the metal board so that after dried, it could have thickness of 24 μm. Then, the coating thus formed was dried at 130° C. The coating of the precursor of the photosensitive polyimide resin was formed in the manner mentioned above. Then, the coating was exposed to light (405 nm, 1,500 mJ/cm$^2$) through a photo mask and, then, the exposed-to-light portion was heated to 180° C. Thereafter, the coating was developed using alkali developing solution, whereby the coating was formed in a predetermined pattern of a negative image. Then, the coating thus patterned was heated at 350° C. to be cured (imidized), whereby the insulating base layer of polyimide resin of 10 μm thick was formed in the form of the predetermined pattern (Cf. FIG. 3(b)).

Then, a thin chromium film of 300 Å thick and a thin copper film of 700 Å thick, serving as a seed film, were sequentially formed on the entire surface of the metal board and the insulating base layer by sputtering. Then, a plating resist having a reverse pattern to the wiring circuit pattern was formed on the seed films, using a dry film resist. Then, the first conductor layer and second conductor layer of copper foil of 12 μm thick were formed in the form of a predetermined wiring circuit pattern by electrolytic copper plating on surfaces of the seed films exposed from the plating resist (Cf. FIG. 3(c)). The wiring circuit pattern was presented in the form of four wires arranged in parallel and spaced from each other at a predetermined distance along a widthwise direction.

Then, after the plating resist was removed by the chemical etching, the seed films (the thin copper film and the thin chromium film) exposed from the first conductor layer and the second conductor layer were removed by the chemical etching.

Then, a protective metal film of a hard, thin nickel film of 0.1 μm thick was formed by electroless nickel plating on the surface of the first conductor layer and the second conductor layer and the surface of the metal board.

Then, solution of precursor of photosensitive polyimide resin was coated over the protective metal film and the insulating base layer and then heated at 130° C., whereby the coating of the precursor of the photosensitive polyimide resin was formed in the manner mentioned above. Thereafter, the coating was exposed to light (405 nm, 1,500 mJ/cm$^2$) through the photo mask and, then, the exposed-to-light portion was heated to 180° C. Thereafter, the coating was developed using the alkali developing solution, whereby the coating was formed in the form of a predetermined pattern to cover the first conductor layer and the second conductor layer and also open at a location where the terminals of the magnetic head terminal portion is formed, a location where the terminals of the control board portion is formed, and a location where the first terminals and the second terminals of the preamplifier terminal portion were formed. Then, the coating thus patterned was heated at 350° C. to be cured (imidized), whereby the insulating cover layer of polyimide resin of 3 μm thick was formed on the insulating base layer in the form of the predetermined pattern to cover the first conductor layer and the second conductor layer (Cf. FIG. 3(d)).

Thereafter, the protective metal film exposed from the openings of the insulating cover layer and the protective metal film formed on the metal board were stripped.

Then, the metal board was cut out into a predetermined outer shape by the chemical etching and also all areas of the metal board confronting the insulating base layer, except its portions corresponding to the suspension board portion, its portions corresponding to the preamplifier terminal portion, and its portions corresponding to the control board terminal portion, were removed by the chemical etching (Cf. FIG. 3(e)).

Thereafter, a nickel plating layer of 2 μm thick and a gold plating layer of 1 μm thick were formed by electrolytic nickel plating and electrolytic gold plating on the surface of the first conductor layer exposed from the insulating cover layer at the location where the terminals of the magnetic head terminal portion, on the surface of the second conductor layer exposed from the insulating cover layer at the location where the terminals of the control board terminal portion, and on the surfaces of the first conductor layer and the second conductor layer located at the boundary therebetween and exposed from the insulating cover layer at the location where the terminals of the preamplifier terminal portion, respectively, thereby producing the terminals on their respective surfaces. The wired circuit board was produced in the manner mentioned above (Cf. FIG. 3(f)).

The preamplifier IC was connected to the terminals of the preamplifier terminal portion of the wired circuit board, and the magnetic head was connected to the terminals of the magnetic head terminal portion.

Comparative Example 1

A suspension board with circuit wherein an insulating base layer of polyimide resin of 10 μm thick formed on a metal board of a stainless foil of 25 μm thick (SUS304H-TA), a conductor layer comprising a wiring circuit pattern of a copper foil of 12 μm thick, and an insulating cover layer of polyimide resin of 3 μm thick were sequentially laminated in layers was prepared.

Also, a control circuit board wherein an insulating base layer of polyimide resin of 12.5 μm thick, a conductor layer comprising a wiring circuit pattern of a copper foil of 18 μm thick, and an insulating cover layer of polyimide resin of 12.5 μm thick were sequentially laminated in layers, and a preamplifier IC was mounted on a preamplifier terminal portion was prepared separately. In this control circuit board, adhesive layers of 15 μm thick are interposed between the insulating base layer and the conductor layer and between the conductor layer and the insulating cover layer, respectively.

Then, after the magnetic head was connected to the magnetic head terminal portion of the suspension board with circuit, the control circuit board terminal portion of the suspension board with circuit and the suspension board terminal portion of the control circuit board were joined together by soldering (Cf. FIGS. 4 and 5).

Evaluation

In the wired circuit board of Example 1, the characteristic impedance between the magnetic head terminal portion and the preamplifier terminal portion and the characteristic impedance between the preamplifier terminal portion and the external terminal portion were measured by a Time Domain Reflectometry (TDR) method. The measurement results are given below. It is to be noted that a design value of the characteristic impedance between the magnetic head terminal portion and the preamplifier terminal portion is 50Ω, and a design value of the characteristic impedance between the preamplifier terminal portion and the external terminal portion is 100Ω.

Between Magnetic Head Terminal Portion and Preamplifier Terminal Portion: 50Ω

Between Preamplifier Terminal Portion and External Terminal Portion: 100Ω

In the suspension board with circuit and wired circuit board of Comparative Example 1, the characteristic impedance between the magnetic head terminal portion and the control circuit board terminal portion, the characteristic impedance between the suspension board terminal portion and the preamplifier terminal portion, and the characteristic impedance between the preamplifier terminal portion and the external terminal portion were measured by the Time Domain Reflectometry (TDR) method. The measurement results are given below. It is to be noted that the design values of the characteristic impedances are the same as those of Example 1.

Between Magnetic Head Terminal Portion and Control Circuit Board Terminal Portion: 50Ω

Between Suspension Board Terminal Portion and Preamplifier Terminal Portion: 95Ω

Between Preamplifier Terminal Portion and External Terminal Portion: 100Ω

It is found that in Comparative Example 1, the electrical resistances changed significantly at a connection point between the control circuit board terminal portion and the suspension board terminal portion located between the magnetic head terminal portion and the preamplifier terminal portion, causing inconsistency in characteristic impedance While the illustrative embodiments of the present invention are provided in the above description, such is for illustrative purpose only and it is not to be construed restrictively. Modification and variation of the present invention that will be obvious to those skilled in the art is to be covered by the following claims.

The disclosure of Japanese patent application Serial No. 2004-219217, filed on Jul. 27, 2004, is incorporated herein by reference.

What is claimed is:

1. A wired circuit board comprising:
an insulating base layer;
a metal board on which the insulating base layer is formed;
a first conductor layer and a second conductor layer formed on the insulating base layer;
an insulating cover layer formed on the insulating base layer to cover the first conductor layer and the second conductor layer, wherein the insulating cover layer comprises openings for a first terminal and a second terminal of a preamplifier terminal portion, for a third terminal being a terminal of a magnetic head terminal portion, and for a fourth terminal being a terminal of an external terminal portion;
the third terminal formed on a surface of the first conductor layer exposed from the insulating cover layer at the forming position for the third terminal being the terminal of the magnetic head terminal portion;
the fourth terminal formed on a surface of the second conductor layer exposed from the insulating cover layer at the forming position for the fourth terminal being the terminal of the external terminal portion; and
the first terminal and the second terminal formed on the surface of the first conductor layer and the second conductor layer respectively exposed from the insulating cover layer at the forming position of the first terminal and the second terminal of the preamplifier terminal portion;
wherein:
the first conductor layer is connected to the magnetic head at the third terminal being the terminal of the magnetic head terminal portion and to the preamplifier at the first terminal of the preamplifier terminal portion;

the second conductor layer is connected to the preamplifier at the second terminal of the preamplifier terminal portion;

the first conductor layer and the second conductor layer are electrically connected through the preamplifier;

a portion of the wired circuit board comprising the magnetic head terminal portion serves as a suspension board portion for supporting the magnetic head;

a portion of the wired circuit board comprising the preamplifier terminal portion and the external terminal portion serves as a control board portion for operating the magnetic head; and the first conductor layer and the second conductor layer are formed from the same material;

further wherein:

the metal board comprises first, second, and third portions which only correspond to the suspension board portion, the external terminal portion and to the preamplifier terminal portion, respectively, with the metal board serving as a supporting board in the first portion which corresponds to the suspension board portion, with the metal board serving as a stiffening layer in the second portion which corresponds to the external terminal portion, and with the metal board serving as a mounting portion in the third portion which corresponds to the preamplifier terminal portion.

2. The wired circuit board according to claim 1, wherein the suspension board portion and the control board portion have a common insulating base layer formed from the same material to be continuous and integral with each other, and wherein the first conductor layer in the suspension board portion is formed on the common insulating base layer and the second conductor layer in the control board portion is formed on the common insulating base layer.

3. The wired circuit board according to claim 2, wherein the suspension board portion and the control board portion have a common insulating cover layer formed from the same material to be continuous and integral with each other, and wherein the common insulating cover layer in the suspension board portion is formed on the common insulating base layer to cover the first conductor layer and the common insulating cover layer in the control board portion is formed on the common insulating base layer to cover the second conductor layer.

* * * * *